(12) United States Patent
James

(10) Patent No.: US 12,284,786 B2
(45) Date of Patent: Apr. 22, 2025

(54) FLUID PHASE CHANGE THERMAL MANAGEMENT ARRANGEMENT AND METHOD

(71) Applicant: Malcolm Barry James, Hectorville (AU)

(72) Inventor: Malcolm Barry James, Hectorville (AU)

( * ) Notice: Subject to any disclaimer, the term of this patent is extended or adjusted under 35 U.S.C. 154(b) by 130 days.

(21) Appl. No.: 17/617,180

(22) PCT Filed: Nov. 27, 2020

(86) PCT No.: PCT/AU2020/051285
§ 371 (c)(1),
(2) Date: Dec. 7, 2021

(87) PCT Pub. No.: WO2021/102517
PCT Pub. Date: Jun. 3, 2021

(65) Prior Publication Data
US 2022/0322579 A1     Oct. 6, 2022

(30) Foreign Application Priority Data

Nov. 29, 2019   (AU) ................................. 2019904525

(51) Int. Cl.
*H05K 7/20* (2006.01)
*F25B 23/00* (2006.01)
*G05D 16/18* (2006.01)

(52) U.S. Cl.
CPC ....... *H05K 7/20381* (2013.01); *F25B 23/006* (2013.01); *G05D 16/187* (2019.01); *H05K 7/20318* (2013.01); *H05K 7/20327* (2013.01)

(58) Field of Classification Search
CPC .......... H05K 7/20327; H05K 7/20381; H05K 7/20318; F25B 23/006; G05D 16/187
See application file for complete search history.

(56) References Cited

U.S. PATENT DOCUMENTS

| 4,725,208 A | * | 2/1988 | Brown ................. F04B 17/046 310/30 |
| 2002/0182281 A1 | | 12/2002 | Minemoto |

(Continued)

FOREIGN PATENT DOCUMENTS

| WO | WO 2018/148806 A1 | 8/2018 |
| WO | WO 2018/163180 A1 | 9/2018 |
| WO | WO 2019/158521 A1 | 8/2019 |

OTHER PUBLICATIONS

International Preliminary Report on Patentability for PCT/AU2020/051285 (PCT/IPEA/409) dated Jul. 27, 2021.

(Continued)

*Primary Examiner* — Larry L Furdge
(74) *Attorney, Agent, or Firm* — Birch, Stewart, Kolasch & Birch, LLP

(57) ABSTRACT

A fluid phase change thermal management cooling method for removing heat from a source of heat includes the steps of: filling a cooling chamber with volume V1 of a fluid phase change thermal management cooling apparatus with a fluid in its liquid phase; increasing the volume of the cooling chamber to volume V2 to vapourise a portion of the fluid from its liquid phase to its vapour phase such that there is substantially only the fluid in its liquid phase and fluid in its vapour phase within the volume V2; allowing a dwell time that provides for at least some of the fluid in its liquid phase that has contact with a heated surface of the cooling chamber to be vaporised; and repeating the steps where timing of the steps and dwell time between steps is selected to control heat build-up within selected limits.

18 Claims, 4 Drawing Sheets

(56) References Cited

U.S. PATENT DOCUMENTS

| | | | |
|---|---|---|---|
| 2003/0205364 A1* | 11/2003 | Sauciuc | F28D 15/0241 |
| | | | 257/E23.088 |
| 2004/0194910 A1 | 10/2004 | Garner et al. | |
| 2004/0244963 A1* | 12/2004 | Hazelton | G03F 7/70758 |
| | | | 165/272 |
| 2007/0193300 A1 | 8/2007 | Tilton et al. | |
| 2011/0056225 A1 | 3/2011 | Campbell et al. | |
| 2011/0232856 A1 | 9/2011 | James | |
| 2014/0240916 A1* | 8/2014 | Daidzic | B23P 15/26 |
| | | | 361/689 |
| 2015/0369541 A1* | 12/2015 | Dupont | F28D 15/043 |
| | | | 165/104.21 |

OTHER PUBLICATIONS

International Search Report for PCT/AU2020/051285 mailed on Jan. 22, 2021.
Written Opinion of the International Searching Authority for PCT/AU2020/051285 (PCT/ISA/237) mailed on Jan. 22, 2021.

\* cited by examiner

FLUID PHASE CHANGE THERMAL MANAGEMENT ARRANGEMENT AND METHOD

The present invention relates to a fluid phase change thermal management arrangement and method or device to provide improved management of the transfer of unwanted heat away from targeted heated areas and towards a disposal area.

In particular the present invention is directed towards the rapid and efficient removal of heat from a heated zone by using the latent heat properties of a cooling fluid evaporating at very low pressures.

BACKGROUND OF THE INVENTION

Conventional cooling systems facilitate the cooling of a hot zone by circulating a cooling fluid around the heated component thereby drawing heat from the heated component into the cooling medium, which is typically then transported away from the source of heat through channels. Conventional approaches involve connecting such cooling chambers in serial or parallel, however each have their disadvantages such as ineffective heat removal, requiring high flow rates of cooling fluid and complex connections between chambers or cavities It is known to provide a method of cooling where there is a cooling chamber, a cooling liquid inside the chamber and a space above the cooling liquid having substantially only the vapour of the cooling liquid therein. A difficulty with such an arrangement is that areas of the cooling chamber that are subject to heat will dry out from evaporation and for cooling to continue further wetting will be required which however may often be difficult to achieve.

Some cooling systems such as conformal cooling systems for plastics injection moulds, provide an advantage in effectively and efficiently directing heat away from the moulding surface of the moulded parts this then allows the injection moulding machine to complete more cycles in a given period of time which therefore results in optimal production rates of moulded parts. Conformal cooling systems, however add complexity and costs to the production of the injection mould due to the design of complex mould channels which can be difficult to design and manufacture.

Water is an excellent cooling medium however it does have some drawbacks compared to other cooling mediums. Water can cause corrosion of the mould or cooling system in the presence of air and build up of scale inside the cooling channels. As such it is useful with a water-cooled mould using flowing water in directed channels to ensure that the cooling channels are maintained in a serviceable manner so as to be able to prevent corrosion, which can result in the mould having a shortened lifespan. The increased service required however adds to the costs associated with the use of these moulds and their downtime due to the high frequency of servicing for preventative maintenance procedures. Cooling of computers is also desirable, especially in installations where high capacity computers are in place, such as in data centres where each computer is capable of generating a significant amount of heat that can impact on the performance of the computer's integrated circuits and computer central processing units (CPUs). High temperatures in a CPU can trigger dynamic frequency scaling where the component is forced to slow down by reducing the operating frequency which results in reduced performance. For low capacity computer CPUs as in common desktop personal computers and notebooks, air cooling of CPUs using fans and cooling fins on an integral heat sink is adequate. Common cooling solutions for high end PCs involve the use of fluid cooled heat sinks in close contact with the casing of the CPU and associated electronics.

Liquid immersion cooling of computer server componentry is a more advanced technique in which computer chips/motherboards/CPU and associated electronics are submerged in a thermally conductive dielectric fluid, the fluid being in direct contact with the electrical components and the heat is then removed from the fluid by flowing it over the circuits and through heat exchangers.

For heat to be transferred from a heated area, it is known that a cooling fluid can be directed to the location requiring heat reduction where the cooling fluid will be vaporised at very low pressure causing heat to be transferred, as latent heat, from the heated area into a gaseous phase fluid which can then transfer that heat away via a heat exchanger/condenser.

In order to achieve a working supply of cooling fluid, in some instances it is desirable to transfer such fluid through a conduit direct to the location of high heat. This can result in problems when there is more than one such conduit required, for example in areas where there are several cooling chambers or cavities at various locations and heights relative to one another. Where the cooling chambers or cavities are at varying heights is it important to be able to control the flow of fluid to each so as to provide a consistent and even provision of cooling medium. When the cooling chambers vaporise fluid inside them then it is important to be able to remove this vapour from the chambers or cavity and allow the insertion of fresh cooling fluid before drying of the fluid on the surface.

Other cooling fluids with lower vapour pressures can address the drawbacks of water but as fluids they still face problems where there are small narrow channels or interstices between components or in the cooling fluid path. None of them are as environmentally friendly as water.

BRIEF DESCRIPTION OF THE INVENTION

In one form of the invention there is a fluid phase change thermal management cooling method where there is a space defined by a surrounding structure including a source of heat, and a heat exchanger providing for vapour condensation, the method comprising the steps of introducing a liquid to the extent of substantially filling the space with the liquid, then removing some of the liquid such that there is only substantially the vapour of the liquid the body of liquid and wetted inner surfaces of the structure, then allowing a dwell time for at least some of the liquid that has contact with the heated surfaces of the surrounding structure to be vapourised then repeating the said steps where the timing of the steps and dwell times between steps is selected to effect a limit of heat build up to a selected extent.

In a further form of the invention there is provided a fluid phase change thermal management apparatus or system having a cooling chamber containing a body of coolant fluid and a pressure controller for controlling the fluid pressure within the cooling chamber and means to condense vapour, the method including the steps of having the pressure controller effect a filling of the chamber with liquid coolant, then extracting some of the coolant liquid in a way that leaves substantially only the vapour of the coolant liquid in the space so that heat transfer will occur as a substantially isothermal process, then after a dwell time allowing the coolant liquid to evaporate to at least some extent then refilling the chamber with liquid coolant and repeating these steps sufficiently quickly to restrict the temperature variation of the surfaces in the chamber to a selected extent.

The controlled recycling of the status of the chamber from being filled with liquid coolant to partially emptied but having only substantially the vapour above the coolant means that when the chamber is refilled then any residual vapour perhaps locked in the intricate shapes and smaller tubes that may be characteristic of shapes requiring cooling, can be either forced out or condensed by the pressure used to cause the filling.

This means that cooling liquid can be applied directly to surfaces requiring cooling and achieve the undoubted efficiency of substantially isothermal heat transfer.

The chamber is defined by a surrounding structure that can withstand the pressure variations that will result and will include incidental components such as a conduit acting as a closed path between a pump and the chamber.

In preference, the coolant fluid occupies all of the cooling chamber.

However, it can be described in another way, for instance where the cooling chamber is part of a structure defining a space that in a functional sense includes the closed path volume and that volume which is varied by the relative position of a piston or other active component of the pressure control means. This then results in the space being able to be described as having two modes one in which the cooling liquid substantially fills the space and a second mode which is larger than the first where there is a space filled with substantially only the vapour of the liquid and the method of the invention is to repetitively cycle between the two modes.

According to this then the invention can be said to reside in a fluid phase change thermal management cooling method where there is an adjustable space defined by a surrounding structure and including a source of heat to be cooled, a body of liquid and a heat exchanger providing for vapour condensation, the adjustable space in one adjusted mode being substantially filled with the body of liquid and in a second adjusted mode having extra space filled with substantially only the vapour of the liquid, the method of the invention being to repetitively transition between the two modes.

In preference, the pressure control means is a pumping means which uses pressure to change the status of the space from a lesser size mode to the larger size mode against effectively atmospheric pressure.

In preference, the volume of the cooling chamber includes the volume of the pressure control means, collectively called the system volume.

In preference, the pressure control means changes the volume of the cooling chamber or system volume from volume 1 (V1) to volume 2 (V2), where V1<V2.

In preference, the pressure control means is a pressure pump.

In preference, the pressure control means is a piston pump and movement of the piston changes the volume where the piston can assume two relative positions where in a withdrawn position it together with the closed path and the main chamber provide the volume V2 a second or larger size mode status and when released it collapses defining the first mode or lesser size status with volume V1.

In preference, the piston pump arrangement includes a main piston pump housing in fluid communication with the cooling chamber.

In preference, the main piston pump housing is fluidly connected to the cooling chamber by a conduit allowing fluid to flow between them in a closed path.

In preference, the conduit is a flexible conduit.

In preference, the piston pump has a plunger/piston head that is movably operated by an actuating device, for example a linear actuating device, which may be an air cylinder.

In preference, a biasing means is operatively attached to the pressure control means to apply a downward force (pressure P1) to the coolant fluid.

In preference, the pressure control means is a positive displacement pump.

In preference, the positive displacement pump is a reciprocating positive displacement pump.

In preference, operation of the pressure control means increases the volume of the cooling chamber to lower the pressure on the coolant fluid to P2.

In preference, the cooling chamber forms with the closed path and the pump chamber a closed system.

In yet a further embodiment of the invention there is a fluid phase change thermal management cooling method for removing heat from a source of heat, the method comprising the steps of:

A. filling a cooling chamber with volume V1 of a fluid phase change thermal management cooling apparatus with a fluid in its liquid phase;

B. increasing the volume of the cooling chamber to volume V2 to vapourise a portion of the fluid from its liquid phase to its vapour phase such that there is substantially only the fluid in its liquid phase and fluid in its vapour phase within the volume V2;

C. allowing a dwell time that provides for at least some of the fluid in its liquid phase that has contact with a heated surface of the cooling chamber to be vaporised; and D. repeating the steps A to C where timing of the steps and dwell time between steps is selected to control heat build-up within selected limits In a further embodiment of the invention there is a method for removing heat from an article, the method including the steps of providing a coolant through a closed path to a cooling chamber, decreasing the pressure within the closed path by a pressure control means to cause the formation of a space above the coolant containing substantially only the vapour of the coolant, allowing at least partial vaporisation of the coolant, the vaporised coolant then flowing to a condensation area/zone and then activating the pressure control means to cause at least a sufficient increase in the pressure in the closed path so as to force out or condense any remaining coolant that is in the gaseous phase thereby filling all spaces within the cooling chamber with coolant in its liquid phase.

In a further form of the invention there is a fluid phase change thermal management apparatus including: a pressure control means; a condenser; a cooling chamber in fluid communication with the pressure control means and the condenser; liquid coolant filling substantially the cooling chamber; the pressure control means operable to effect a change in pressure on the liquid coolant fluid within the cooling chamber from a first pressure P1 to a second pressure P2 and cause a portion of the liquid coolant to vapourise.

In a further form of the invention there is a fluid phase change thermal management cooling method where there is an adjustable space defined by a confining structure and including a source of heat to be cooled, a body of liquidating chamber and thereby and a heat exchanger providing for vapour condensation, the adjustable space in one adjusted mode being substantially filled with the body of liquid and in a second adjusted mode having extra space filled with substantially only the vapour of the liquid, the method of the invention being effecting the steps of repetitively transitioning between the two modes.

A pressure controller is operated to alternate in steps where these are selected between decreasing partially the pressure in the closed path and increasing at least partially the pressure in the closed path to provide for surfaces requiring cooling being kept wet for a sufficient time to maintain temperature variation to a selected extent.

In certain embodiments of the present invention, sections or portions of the cooling chamber are constructed or made from a material composition having high heat conductivity, which may include steel, copper or aluminium or other suitable materials.

In other certain embodiments the coolant material is a fluid material suitable for use in thermal management or cooling system use.

In preference, the coolant is selected from at least one of the group of coolants such as water, hydrocarbon based coolant and specialised fluids that are safe to be used directly on electronic components.

In certain embodiments of the thermal management apparatus, system or method, there is a plurality of cooling chambers.

In preference, the pressure control means is connectable to an external power source.

In preference, the condensation area/zone includes a condenser apparatus, the condenser apparatus suitable to condense the coolant.

In preference, the condenser apparatus is incorporated as part of the cooling chamber.

In certain embodiments of the present invention the article to be cooled may be a computer chip, motherboard, CPU or other associated computer electronic article, heat generating engine, plastics moulding apparatus, in particular for example the mould used in injection moulding systems where there is the need to remove heat from the system in order to decrease cycle times.

In other embodiments the present invention may include more than one pump, for example, several pumps may work in series in order to create the necessary pressure differential and or frequency of pressure differentials.

BRIEF DESCRIPTION OF THE DRAWINGS

In order to better understand the present invention certain embodiments will now be described by way of non-limiting examples only, with reference to the accompanying drawings, in which.

DESCRIPTION

The terms "pressure control means" "pump means", "vacuum means" and "pressure differential means" as used throughout the application refers to a mechanism or means that is capable of controlling or altering the pressure within the system. Such mechanisms can include pumping means such as, but not limited to, positive displacement pumps, piston pumps or other such suitable pumping mechanisms that are able to create a pressure differential to the coolant fluid filling a defined volume or area/zone.

The term "first pressure", "first level pressure", "P1" as used throughout the specification refers to a pressure level that is greater than a second pressure.

The term "second pressure", "second level pressure", "P2" as used throughout the specification refers to a pressure level that is less than a first or initial pressure.

The term "latent heat of vaporization" or "heat of evaporation", is the amount of heat that must be added to a fluid substance, to transform a quantity of that fluid substance into a gas.

The term "volume 1", "V1", "volume 2", "V2" as used throughout the specification refers to a volume that can include the sum of volumes of the cooling chamber, piston chamber and any other fluidly connection volume, where "volume 1", "V1" is less than "volume 2", "V2".

Figure 1:
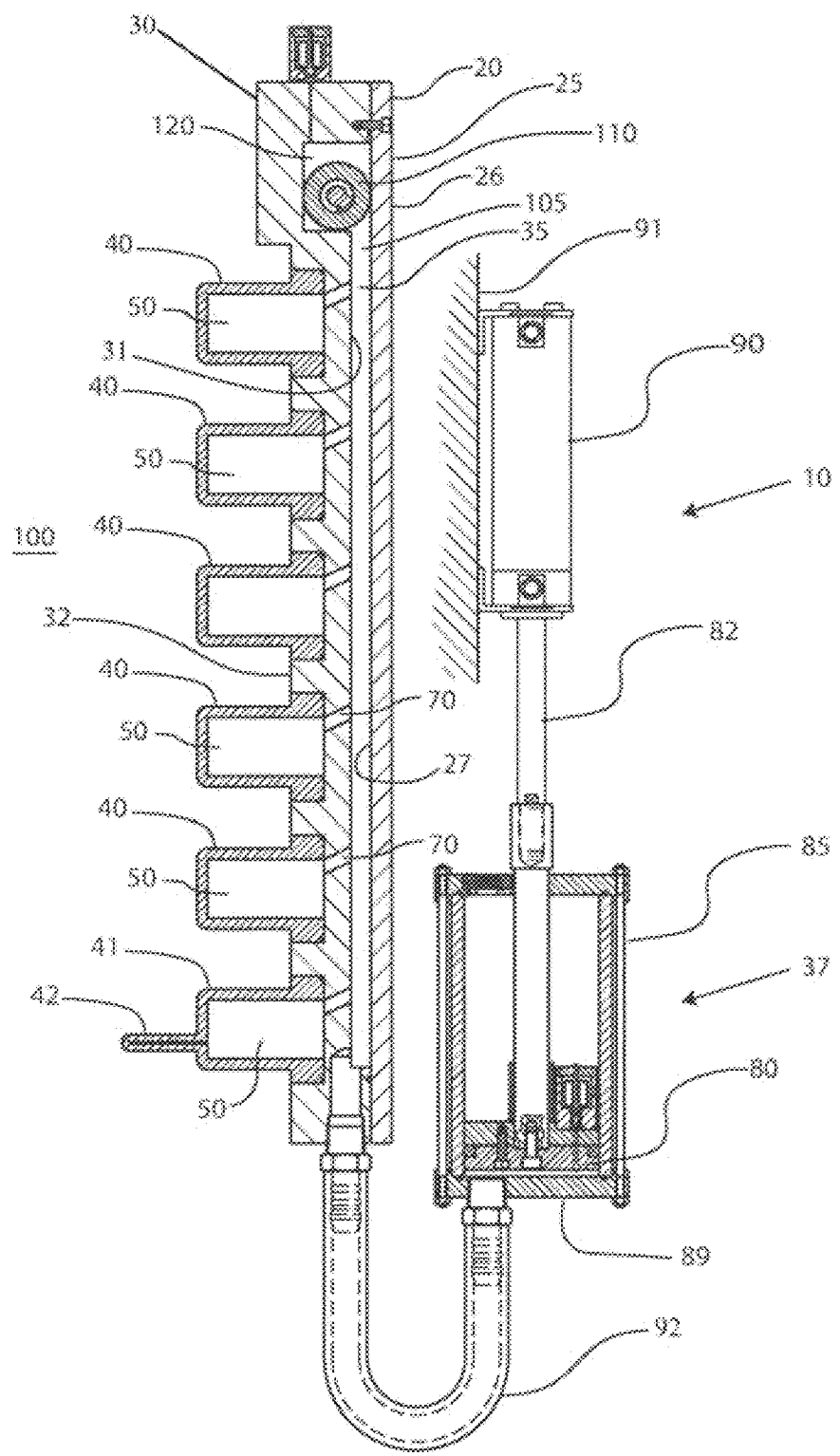
FIG. 1 shows a cross sectional view of the basic components of the phase change thermal management apparatus in a first position with the pressure in the system is at a first pressure.

Referring now to FIG. 1, this shows a cross sectional side view of an embodiment of the phase change thermal management apparatus 10 of the present invention which includes a main body 20 having a top plate 25, having an outer surface 26 and an inner surface 27, base 30 and a pressure control means 37, for example a linear actuating device, which may be an air cylinder pump, which is applied to moulding of plastics.

The main body 20 contains a cooling chamber 35, that may be defined by a surrounding structure, that can withstand the pressure variations, which incorporates a main channel that is vertically orientated and traverses, in this embodiment, the full height of the cooling chamber. The cooling chamber 35 is defined by the inner surface 27 of the top plate 25 and the inner surface 31 of the base 30 and filled as completely as possible with a liquid coolant. On the outer surface 32 of the base 30 are a number of extensions to the cooling chamber, which represents the cooling zone/area which is typically located or positioned closest to or in the zone where it is desirable for heat to be removed. In FIG. 1 the cores 40 are removably secured to the base 30 and each core 40 has an internal cavity area 50 acting as an extension to the cooling chamber. The core 41 has the internal cavity 50 as well as the outwardly interstices section 42, the internal cavity of which is very narrow and is fluidly connected to the internal cavity 50.

Each internal cavity 50 of the respective core (40 or 41) is fluidly connected to the cooling chamber 35 by way of the angled secondary channel 70. Although in the present invention the channel is shallow at an upwardly inclined angle, extending upwardly away from the internal cavity 50, other angles of secondary channel are considered to also fall within the scope of the invention although in some embodiments the upwardly extending angled secondary channel 70 is advantageous.

Fluidly connected to the channel of the cooling chamber 35 is a pressure control means 37.

The pressure control means 37, in the present embodiment, is a reciprocating positive displacement pump which includes a piston head 80 operatively connected to the shaft 82 which in turn is operatively connected to an actuator mechanism 90 mounted to a surface 91. The pressure control means 37 includes a main housing 85 within which the piston head 80 is closely fitted such that the sides of the piston head 80 create a tight seal against the interior sidewalls of the housing 85. A conduit 92 fluidly connects the chamber 87 of the housing 85 with the cooling chamber 35.

Operation of the actuator 90 urges the shaft 82 and the piston head 80 upwards and away from the base 89 of the housing 85, increasing the volume of the system from V1 to V2, thus creating a pressure decrease on the coolant fluid within the cooling chamber 35 and the fluidly connected internal cavities 50 of the core 40 and 41. As the coolant fluid substantially completely fills the inner volume of the chambers of the phase change thermal management apparatus 10 then the reduction in pressure is applied to all surfaces. As the actuator 90 operates, it causes the shaft 82 and thus the piston head 80, to operate in a reciprocation manner, moving the piston head 80 alternatively between a first position, where it is applying a force to the coolant fluid, forcing it out of the chamber 87 or resting upon a surface of the fluid in the chamber 87, to a second position where is draws coolant fluid into the chamber 87.

In the first position, at volume V1, the pressure in the system is said to be P1. When the piston head 80 is drawn up into the main pump housing 85, towards its second position, at volume V2, which is greater than V1, this then acts to reduce the pressure in the system, drawing the coolant fluid in the system into the main pump housing 85 and thus causing a reduction in pressure in the system, said to be P2. In the present invention P1>P2.

A coolant fluid, for example water, is placed into the system 10, although other coolant mediums are considered to fall within the scope of the invention. The coolant fluid fills the entire cooling chamber 35 including the internal cavities 50 of the cores 40 and 41. In FIG. 1 the internal pressure of the system, which includes the cooling chamber 35, the internal cavities of the cores (40 and 41) and chamber 87 of the housing 85 is the first pressure, P1. This pressure occurs when the piston 80 is in the down position, forcing any gas/liquid in the chamber 87 outwards, through the conduit 92 and into the cooling chamber 35 and the pressure can be as high as necessary for safe and effective operation.

Figure 2:
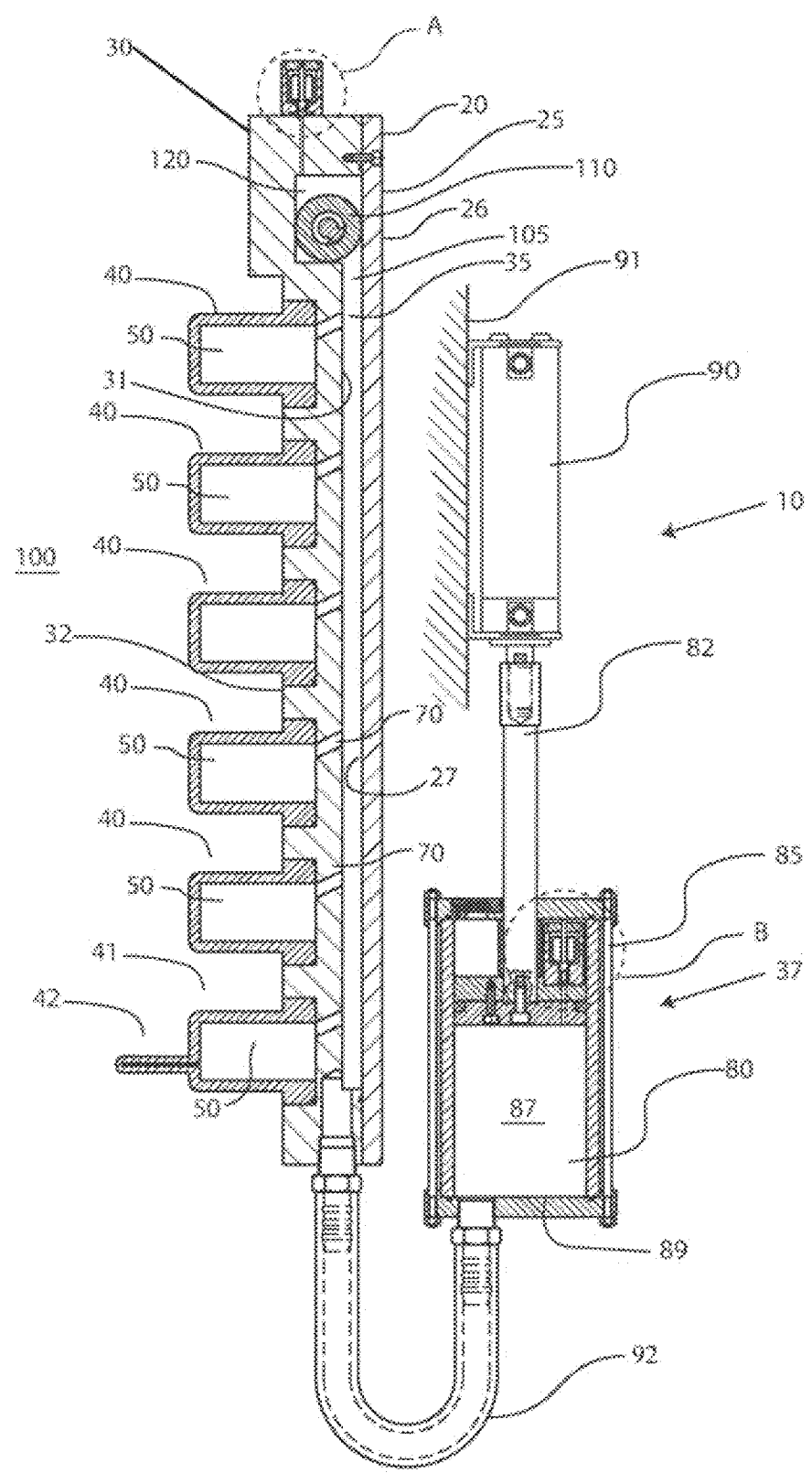
FIG. 2 is the same view as FIG. 1, with the pressure control means in an active position causing a reduction of pressure in the system to a second pressure, with the second pressure is less than the first pressure.
Figure 3:
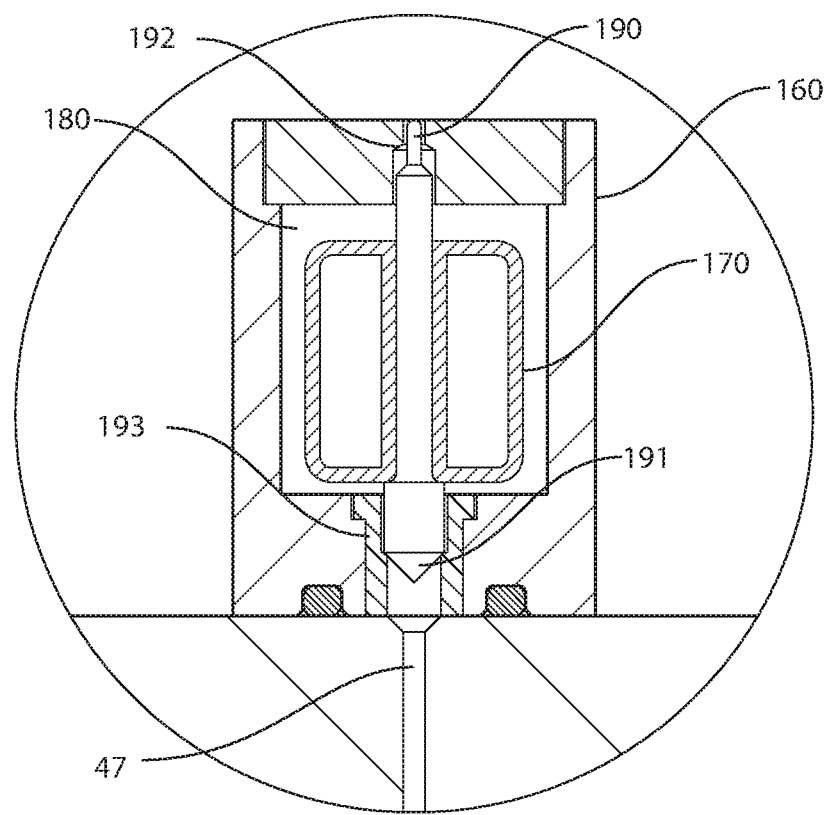
FIG. 3 is a close up view of the valve in section A and section B from FIG. 2.

As shown in FIG. 2, in operation, the system activates the actuator 90 to operate causing the piston head 80 to withdraw into the main piston pump housing 85 thus causing the internal volume of the system, which includes the cooling chamber 35, the piston pump chamber 87 (also referred to as the system volume), to increase. As it is a closed path system the increase in volume of the system volume, from a first volume V1 to a second volume V2, creates an immediate reduction of the pressure from P1, the initial starting pressure on the coolant fluid, to a lower pressure P2 on the coolant fluid and thus across the entire interior surface of internal cavities 50 of the cores 40 through secondary connecting channels 70 and into the main body chamber 35.

As the article heats up, for example in an injection mould apparatus that is in operation and heat is generated through the moulding cycling into the mould body and moulding surface 100, heat energy is transferred through the cooling cores 40 and into the coolant fluid in the internal cavities 50. The reduction in pressure affects all connected interior surfaces and thus the coolant fluid at those surfaces where heat is being generated will be under reduced pressure causing the heat energy in the coolant fluid to be immediately converted to latent heat of evaporation, the coolant fluid in that cavity will "boil" and the resulting vapour will rise toward the condenser 110 where it will be converted back to its liquid phase.

Once the coolant vapour has been condensed by the condenser 110 it will then travel down a return conduit (not shown) to be reintroduced at a lower end of the cooling chamber 35. As the pressure in the system drops to P2 and the coolant fluid begins to vapourise, this effect is an isothermal process in that the vapourising coolant removes heat from the cooling chamber without affecting the temperature of the coolant. The resultant vapourised coolant then is drawn out of the internal cavities 50 of the cores 40 through the angled secondary connecting channels 70 of the cooling chamber 35 whereby it can move to the condenser to reform back into liquid phase coolant.

In some embodiments a condenser 110 may be present, for example at the condensing section 120 positioned at the upper end of the 105 of the cooling chamber 35 to promote condensation of the coolant fluid.

At the end of the time period at which the piston head 80 is withdrawn into the main piston pump housing, the actuator 90 is again activate to force the piston head 80 towards the end 89 thus reducing the overall volume in the system and so causing an increase in pressure in the system and on the vaporised coolant fluid sufficient to cause it to condense out of the gas phase back into the liquid phase.

The change of the piston head 80 from its first position, as shown in FIG. 1 to its second position in FIG. 2 is considered to be a single cycle and the actuator 90 can be controlled by a computer to activate at a desired number of cycles time per unit of time. For example, in certain circumstances the cycle time of the actuator may effect movement of the piston head 80 between its first and second position of with a period of, say, five seconds:

pressure at rest on coolant fluid P1;
changing the system volume from V1 to V2 thus causing a pressure decrease (pump on to apply pulling force to coolant fluid);
coolant fluid expansion time 1 second, pressure on coolant fluid decreases to P2;
dwell time 3 seconds, pressure on coolant fluid is P2
pressure return to normal, changing the system volume from V2 to V1, causing pressure on coolant fluid to increase to P1 1 second As required the cycles time may be operatively controlled to increase or decrease a set number of times as required by application. At each cycle of the pressure control means 37, when the pressure drops in the system, coolant in the internal cavities 50 of the cores 40, or elsewhere in the system, that have absorbed heat then evaporates thus causing heat to be removed.

In some embodiments a valve mechanism 160 can be positioned on the main body 20 in communication with the cooling chamber 35 by way of channel 47, the valve mechanism 160 including a float valve 170 in the chamber 180 having a needle projections 190 and 191 axially aligned and shaped to fit within needle valve seats 192 and 193 respectively. As the float valve body 170 rises upwards in the chamber 180 the upper needle 190 fits into the needle seat 192 and as the float valve body 170 descends in the chamber 180 the lower needle 191 fits into the needle seat 193. This valve mechanism provides a bleed point that can also act as an air lock assembly so that when pressure in the system increases the valve is moved upwards to seat the needle 190 into the needle seat 192. This works to provide venting of air in the cooling chamber and associated spaces in the surrounding structure. Air can get into the system by simple air leaks or release of dissolved air in the liquid coolant. It is found that in most situations the recycle action is sufficient to remove any air contaminant through the vent. In this way the process will maintain the access to all parts of a heat source and be effective to remove heat.

On the piston head 80 there is a piston head valve 200 having a float valve 210 having an internal chamber 212 in fluid communication with the piston chamber 87 by way of channel 213, a lower needle 215 and lower needle seat 220. The needle 230 on the float valve 210 extends though the aperture 240. A side port 230 extends though the wall of the piston head valve 200 to allow any fluid entering the chamber 212 to escape into the space above the piston head 80. This maintains the fluid level to provide an air-lock.

Figure 4:
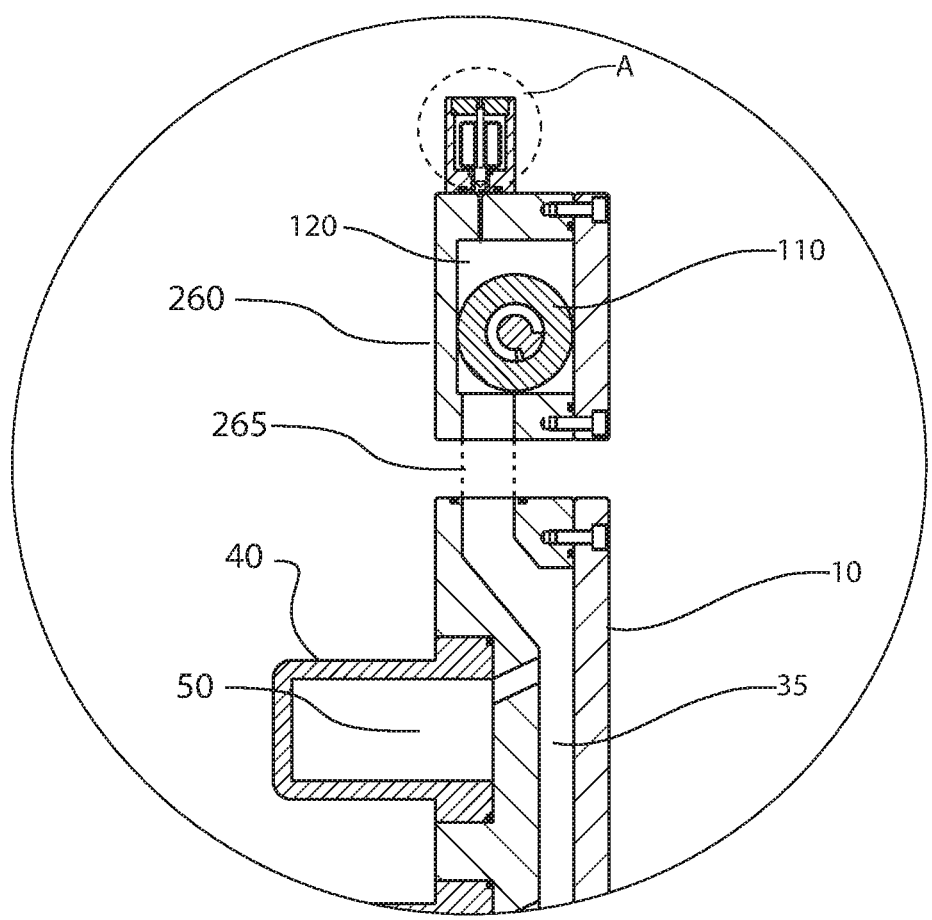
FIG. 4 is a close up view of the condenser section as a separate module to the main body.

In some embodiments, as shown in FIG. 4, the condenser section 260 is separated from the main body 10 of the and fluidly connected to the channel of the main body chamber 35 by a conduit 265 or alternatively coupled directly to the main body 10 so that it can be attached and removed as required for maintenance.

A biasing means, such as an air strut or similar, can be attached to the head 80 of the piston or the shaft 82 so as to bias the head 80 to its original starting position so as to apply a force to the coolant fluid in the system.

The fluid phase change thermal management cooling method, comprises the steps of:
   introducing a liquid into a cooling chamber 35 of a fluid phase change thermal management cooling apparatus 100 to the extent of substantially filling the cooling chamber 35 with the liquid;
   increasing the volume of the cooling chamber and any fluidly connected chambers, such as for example, the piston chamber and any connecting conduit;
   allowing a dwell time for at least some of the liquid that has contact with the heated surfaces of the cooling chamber to be vapourised; and then
   repeating the said steps where the timing of the steps and dwell times between steps is selected to reduce heat build-up to a selected extent.

The heated surfaces of the cooling chamber 35, being the cores 40 and 41 of the outer surface 32 of the fluid phase change thermal management cooling apparatus 100, which is exposed and in contact with heated moulding material. The method of filling the cooling chamber 35 with liquid is carried out in a way so that the inner surfaces of the cooling chamber 35, which includes the internal cavities 50 of the cores 40 and 41 are at least substantially wetted.

Any unwanted gas in the system may be purged by an uppermost vent that will allow release of the gas to atmosphere when the piston moves to P1 with the chamber volume being reduced to V1.

As should now be seen, the present invention provides a thermal management method and apparatus for cooling a source of heat in an efficient manner by reducing pressure within the cooling chamber so as to cause the coolant fluid, or a portion thereof, to evaporate at a low temperature.

The thermal management method and apparatus can be used in many situations where it is desirable to remove heat and uses a relatively simple construction and configuration.

A fluid phase change thermal management cooling method where there is an adjustable space defined by a confining structure and including a source of heat to be cooled, a body of liquidating chamber and thereby and a heat exchanger providing for vapour condensation, the adjustable space in one adjusted mode being substantially filled with the body of liquid and in a second adjusted mode having extra space filled with substantially only the vapour of the liquid, the method of the invention being effecting the steps of repetitively transitioning between the two modes.

A fluid phase change thermal management cooling method for removing heat from a source of heat, the method comprising the steps of:

A filling a cooling chamber with volume V1 of a fluid phase change thermal management cooling apparatus with a fluid in its liquid phase;

B increasing the volume of the cooling chamber to volume V2 to vapourise a portion of the fluid from its liquid phase to its vapour phase such that there is substantially only the fluid in its liquid phase and fluid in its vapour phase within the volume V2;

C allowing a dwell time that provides for at least some of the fluid in its liquid phase that has contact with a heated surface of the cooling chamber to be vapourised; and D repeating the steps A to C where timing of the steps and dwell time between steps is selected to control heat build-up within selected limits.

A fluid phase change thermal management method for removing heat from an article, the method including the steps of providing a coolant fluid in a closed path in a cooling chamber, increasing a volume within the closed path from V1 to V2 using a pressure control means to vapourise a portion of the coolant fluid from its liquid phase to its vapour phase such that there is substantially only the fluid in its liquid phase and fluid in its vapour phase within the volume V2 allowing at least partial vaporisation of the coolant fluid it its liquid phase to its vapour phase, the coolant vapour so produced then flowing to a condensation zone and then activating the pressure control means to reduce the volume of the cooling chamber from V2 to V1 and thereby cause at least a partial increase in the pressure in the closed path so as to force out or condense any remaining coolant that is in the gaseous phase thereby filling all spaces within the cooling chambers with coolant in its liquid phase and the pressure control means operates to alternate between increasing partially the pressure in the closed path and decreasing at least partially the pressure in the closed path, thus causing at least a portion of the coolant to transform from its liquid phase to a vapour phase in a condensation zone of the cooling chamber.

The fluid phase change thermal management method of any one of the above, wherein the pressure pump is a piston pump.

The fluid phase change thermal management method, wherein the piston pump includes a main piston pump housing in fluid communication with the cooling chamber.

The fluid phase change thermal management method, wherein the main piston pump housing is fluidly connected to the cooling chamber by a conduit.

The fluid phase change thermal management method, wherein the conduit is a flexible conduit.

The fluid phase change thermal management method, wherein the piston pump is movably operated by an actuating device, for example a linear actuating device.

The fluid phase change thermal management method of any one of above, wherein a biasing means is operatively attached to the pressure control means to apply a downward force (pressure P1) to the coolant fluid.

The fluid phase change thermal management method of any one of the above, wherein operation of the pressure control means increases the volume of the cooling chamber to lower the pressure on the coolant fluid to P2.

The fluid phase change thermal management method of any one of the above, wherein the cooling chamber forms a closed system.

The fluid phase change thermal management method of any one of above, wherein the coolant is selected from at least one of the group of coolants such as water, hydro carbon based coolant or mixtures thereof, or specialised fluids that are safe to use in electronic circuits.

The fluid phase change thermal management method of any one of above, wherein the pressure control means is connectable to an external power source.

The fluid phase change thermal management method of any one of the above, wherein the condensation zone includes a condenser suitable to condense the coolant vapour.

The fluid phase change thermal management method, wherein the condenser is separate to the cooling chamber and in fluid connection thereto.

The fluid phase change thermal management method of any one of the above, wherein the article may be a computer chip, motherboard, CPU or other associated computer electronic article, heat generating engine, moulding apparatus.

A fluid phase change thermal management apparatus including a pressure control means; a condenser; a cooling chamber in fluid communication with the pressure control means and the condenser; liquid coolant filling substantially the cooling chamber; the pressure control means operable to effect a change in pressure on the liquid coolant fluid within the cooling chamber from a first pressure P1 to a second pressure P2 and cause a portion of the liquid coolant to vapourise.

The fluid phase change thermal management apparatus, wherein the pressure control means is a pressure pump.

The fluid phase change thermal management apparatus, wherein the pressure pump is a piston pump.

The fluid phase change thermal management apparatus, wherein the piston pump has a piston head that is movably operated by an actuating device, for example a linear actuating device.

The fluid phase change thermal management apparatus used with the above method.

The invention claimed is:

1. A fluid phase change thermal management cooling method for removing heat from a source of heat, the method comprising the steps of:
   A. filling a cooling chamber with volume V1 of a fluid phase change thermal management cooling apparatus with a fluid in its liquid phase;
   B. increasing the volume of the cooling chamber to volume V2 to vapourise a portion of the fluid from its liquid phase to its vapour phase such that there is substantially only the fluid in its liquid phase and fluid in its vapour phase within the volume V2;
   C. allowing a dwell time that provides for at least some of the fluid in its liquid phase that has contact with a heated surface of the cooling chamber to be vaporised; and
   D. repeating the steps A to C where timing of the steps and a dwell time between the step A to the step C is selected to control heat build-up within selected limits,
   wherein the cooling chamber includes a main channel orientated in a vertical direction, and a plurality of cavities fluidly connected to the main channel at intervals along a longitudinal axis of the main channel and defined with the heated surface, and wherein each of the plurality of cavities is fluidly connected to the main channel by an upwardly inclined secondary channel such that the fluid in each cavity in a vapour phase flows through the secondary channel upwardly toward a top portion of the main channel.

2. The fluid phase change thermal management method of claim 1, wherein the step B of increasing the volume of the cooling chamber to volume V2 is performed by a pressure pump, and wherein the pressure pump is a piston pump, diaphragm pump or displacement pump.

3. The fluid phase change thermal management method of claim 2, wherein the piston pump includes a main piston pump housing in fluid communication with the cooling chamber.

4. The fluid phase change thermal management method of claim 3, wherein the main piston pump housing is fluidly connected to the cooling chamber by a conduit.

5. The fluid phase change thermal management method of claim 4, wherein the conduit is a flexible conduit.

6. The fluid phase change thermal management method of claim 3, wherein the piston pump is movably operated by an actuating device.

7. The fluid phase change thermal management method of claim 1, wherein operation of a pressure control pump increases the volume of the cooling chamber to lower the pressure on the coolant fluid to P2.

8. The fluid phase change thermal management method of claim 1, wherein the cooling chamber forms a closed system.

9. The fluid phase change thermal management method of claim 1, wherein the coolant is selected from at least one of the group of water, hydro carbon based coolant or mixtures thereof.

10. The fluid phase change thermal management method of claim 1, wherein the source of heat is a computer chip, motherboard, CPU, other associated computer electronic article, heat generating engine, or moulding apparatus.

11. The fluid phase change thermal management method of claim 2, wherein a difference between the volume V1 and the volume V2 is achieved by volume of a chamber of the pressure pump that forms part of the cooling chamber when the step B is performed.

12. A fluid phase change thermal management method for removing heat from an article, the method including the steps of:
   providing a coolant fluid in a closed path in a cooling chamber,
   increasing a volume within the closed path from V1 to V2 using a pressure control pump to vapourise a portion of the coolant fluid from its liquid phase to its vapour phase such that there is substantially only the fluid in its liquid phase and fluid in its vapour phase within the volume V2 allowing at least partial vaporisation of the coolant fluid from its liquid phase to its vapour phase,
   the coolant vapour so produced then flowing to a condensation zone and then activating the pressure control pump to reduce the volume of the cooling chamber from V2 to V1 and thereby cause at least a partial increase in the pressure in the closed path so as to force out or condense any remaining coolant that is in the gaseous phase thereby filling all spaces within the cooling chambers with coolant in its liquid phase and the pressure control pump operates to alternate between increasing partially the pressure in the closed path and decreasing at least partially the pressure in the closed path, thus causing at least a portion of the coolant to transform from its liquid phase to a vapour phase in a condensation zone of the cooling chamber,
   wherein the cooling chamber includes a main channel orientated in a vertical direction, and a plurality of cavities fluidly connected to the main channel at intervals along a longitudinal axis of the main channel and defined with a heated surface, and wherein each of the plurality of cavities is fluidly connected to the main channel by an upwardly inclined secondary channel such that the fluid in each cavity in a vapour phase flows through the secondary channel upwardly toward a top portion of the main channel.

13. The fluid phase change thermal management method of claim 12, wherein the condensation zone includes a condenser suitable to condense the coolant vapour.

14. The fluid phase change thermal management method of claim 13, wherein the condenser is separate to the cooling chamber and in fluid connection thereto.

15. A fluid phase change thermal management apparatus including:
   a pressure control pump;
   a condenser;
   a cooling chamber in fluid communication with the pressure control pump and the condenser;
   liquid coolant filling substantially the cooling chamber;
   the pressure control pump operable to effect a change in volume of the cooling chamber in fluid communication with the pressure control pump to effect a change in pressure on the liquid coolant fluid within the cooling chamber from a first pressure P1, at a first volume V1, to a second pressure P2, at a second volume V2, and cause a portion of the liquid coolant to vapourise, wherein the cooling chamber includes a main channel orientated in a vertical direction, and a plurality of cavities fluidly connected to the main channel at intervals along a longitudinal axis of the main channel and defined with a heated surface, and wherein each of the plurality of cavities is fluidly connected to the main channel by an upwardly inclined secondary channel such that the fluid in each cavity in a vapour phase flows through the secondary channel upwardly toward a top portion of the main channel.

16. The fluid phase change thermal management apparatus of claim 15, wherein the pressure control pump is a pressure pump, a piston pump or a diaphragm pump.

17. The fluid phase change thermal management apparatus of claim 15, wherein the pressure control pump has a piston head that is movably operated by an actuating device.

18. The fluid phase change thermal management apparatus of claim 15, wherein the pressure control pump is configured to repeat the following operations including:
   A. filling the cooling chamber with volume V1 of the fluid phase change thermal management cooling apparatus with the fluid in its liquid phase;
   B. increasing the volume of the cooling chamber to volume V2 to vapourise a portion of the fluid from its liquid phase to its vapour phase such that there is substantially only the fluid in its liquid phase and fluid in its vapour phase within the volume V2; and
   C. allowing a dwell time that provides for at least some of the fluid in its liquid phase that has contact with the heated surface of the cooling chamber to be vaporised,
   wherein timing of the operations and dwell time between the operations is selected to control heat build-up within selected limits.

\* \* \* \* \*